(12) United States Patent
Soulas et al.

(10) Patent No.: US 12,055,583 B2
(45) Date of Patent: Aug. 6, 2024

(54) METHOD AND DEVICE FOR ESTIMATING THE AGEING OF AN ELECTRONIC COMPONENT

(71) Applicant: VITESCO TECHNOLOGIES GMBH, Hanover (DE)

(72) Inventors: Nicolas Soulas, Toulouse (FR); Thierry Bavois, Toulouse (FR)

(73) Assignee: VITESCO TECHNOLOGIES GMBH, Hanover (DE)

( * ) Notice: Subject to any disclaimer, the term of this patent is extended or adjusted under 35 U.S.C. 154(b) by 435 days.

(21) Appl. No.: 17/425,804

(22) PCT Filed: Mar. 27, 2020

(86) PCT No.: PCT/EP2020/058830
§ 371 (c)(1),
(2) Date: Jul. 26, 2021

(87) PCT Pub. No.: WO2020/193780
PCT Pub. Date: Oct. 1, 2020

(65) Prior Publication Data
US 2022/0170980 A1 Jun. 2, 2022

(30) Foreign Application Priority Data
Mar. 28, 2019 (FR) ...................................... 1903213

(51) Int. Cl.
*G01R 31/28* (2006.01)
(52) U.S. Cl.
CPC ................................ *G01R 31/2849* (2013.01)
(58) Field of Classification Search
CPC ................ G01R 31/2849; G01R 31/30; G01R 31/2874; G01R 31/2642
See application file for complete search history.

(56) References Cited

U.S. PATENT DOCUMENTS 7,457,725 B1* 11/2008 Civilini .............. G05B 23/0283
702/183
7,581,434 B1* 9/2009 Discenzo ............. G01N 33/2888
73/53.01
(Continued)

FOREIGN PATENT DOCUMENTS

CN 103293461 A 9/2013
CN 104620122 A 5/2015
(Continued)

OTHER PUBLICATIONS

International Search Report and Written Opinion of the ISA for PCT/EP2020/058830, mailed Jun. 9, 2020, 11 pages.
(Continued)

*Primary Examiner* — Mohammad K Islam
(74) *Attorney, Agent, or Firm* — NIXON & VANDERHYE

(57) ABSTRACT

A method for estimating the aging of an electronic component, characterized in that it includes the following steps: —compiling a thermal specification of the electronic component in order to determine a reference lifetime, —determining a reference temperature quantity, —measuring the actual temperature of the electronic component in operation, —determining an actual temperature quantity, —determining an equivalent operating time at the actual temperature, —transposing this equivalent operating time to the reference temperature to obtain a transposed operating time, —summing the transposed operating times to obtain a consumed lifetime comparable to the reference lifetime.

20 Claims, 2 Drawing Sheets

(56) References Cited

U.S. PATENT DOCUMENTS

| | | |
|---|---|---|
| 10,168,381 B2 | 1/2019 | Butron-ccoa |
| 10,684,329 B2 | 6/2020 | Gajewski |
| 2005/0049833 A1* | 3/2005 | Rossi ................. G01R 31/2846 702/182 |
| 2005/0280766 A1* | 12/2005 | Johnson ............... G09G 3/3225 345/84 |
| 2014/0343748 A1* | 11/2014 | Suzuki ................... G05B 15/02 700/300 |
| 2015/0002025 A1* | 1/2015 | Maricic .................. H05B 45/12 315/151 |
| 2018/0017612 A1 | 1/2018 | Burton-Ccoca et al. |
| 2020/0132749 A1* | 4/2020 | Ryu ................... G01R 31/2894 |

FOREIGN PATENT DOCUMENTS

| | | |
|---|---|---|
| CN | 105842598 A | 8/2016 |
| CN | 107209222 A | 9/2017 |
| CN | 108918989 A | 11/2018 |
| DE | 10 2013 211038 | 10/2014 |
| DE | 10 2009 032063 | 1/2018 |

OTHER PUBLICATIONS

Office Action, issued in Chinese Patent Application No. 202080025065.5 dated Nov. 30, 2023.

\* cited by examiner

[Fig. 1]
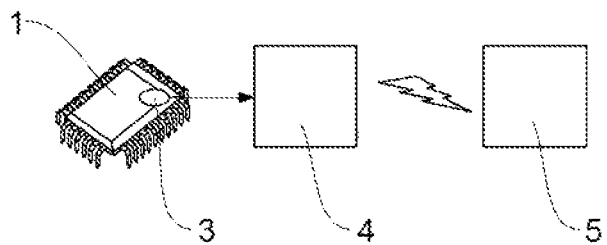
[Fig. 2]
| Tj_MOS | Hours | Percentage |
|---|---|---|
| Tj<90°C | 1573 | 19.65% |
| 90°C<TJ<100°C | 1818 | 22.72% |
| 100°C<Tj<110°C | 2499 | 31.23% |
| 110°C<Tj<120°C | 1211 | 15.14% |
| 120°C<Tj<130°C | 748 | 9.35% |
| 130°C<Tj<140°C | 139 | 1.73% |
| 140°C<Tj<150°C | 11 | 0.14% |
| 150°C<Tj<170°C | 4 | 0.04% |
[Fig. 3]
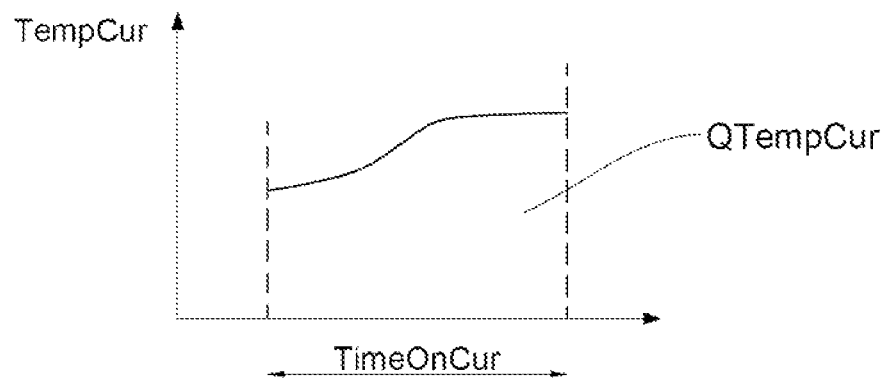

[Fig. 4]
| Specification | | Acceleration factor for Tref: 150°C | | |
|---|---|---|---|---|
| Board environment temperature (°C) | Hours (h) | Tref (°C) | Acceleration factor | Equivalent duration in HTOL (h) |
| 80 | 4500 | 150 | 44.77 | 101 |
| 100 | 5000 | 150 | 13.06 | 383 |
| 120 | 500 | 150 | 4.32 | 116 |
| 140 | 100 | 150 | 1.59 | 63 |
| 150 | 10 | 150 | 1.00 | 10 |
| | 10110 | | | 672 |
TempSpec1
TimeSpec1
ATemp
TempRef
TimeSpecTrans1
TotalTimeRef
[Fig. 5]
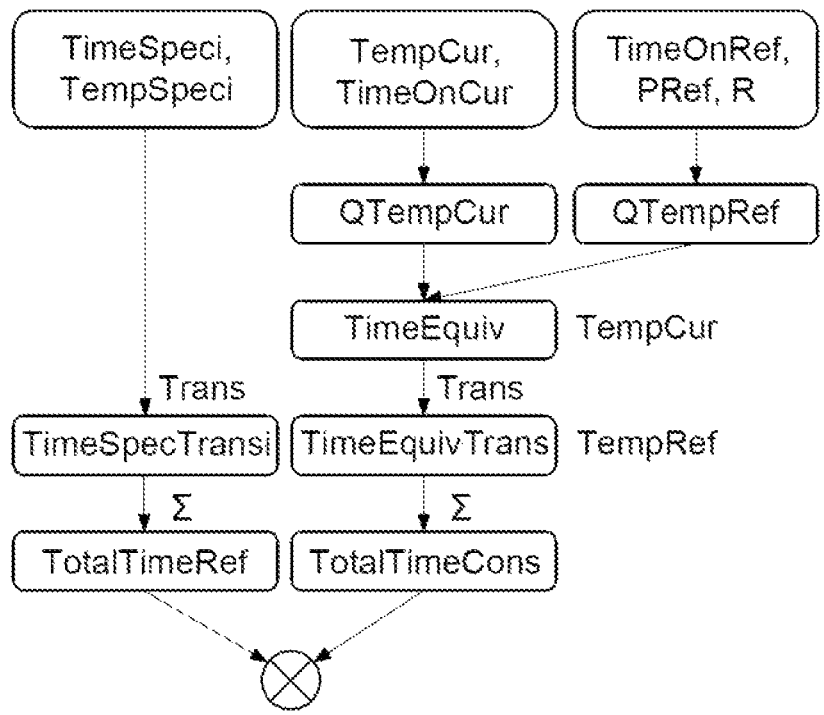

METHOD AND DEVICE FOR ESTIMATING THE AGEING OF AN ELECTRONIC COMPONENT

This application is the U.S. national phase of International Application No. PCT/EP2020/058830 filed 27 Mar. 2020, which designated the U.S. and claims priority to FR Patent Application No. 1903213 filed 28 Mar. 2019, the entire contents of each of which are hereby incorporated by reference.

BACKGROUND OF THE INVENTION

Field of the Invention

The invention relates to the field of electronics and more particularly to a method and a device for estimating the aging of an electronic component.

Description of the Related Art

It is known to estimate the lifetime of an electronic component depending on calibrated tests that predict an operating profile or thermal specification comprising a plurality of operating ranges each defined by an operating temperature and by a duration. As long as the electronic component has not "consumed" said profile, it is supposed to remain operational. However, the electronic component most often has a life profile that does not reproduce the test profile.

The consequences of a failure of an electronic component may be very different, varying from simple stoppage of the performed function to a fire/explosion or other consequences that could endanger human lives, particularly in the automotive industry in which critical functions are entrusted to electronics.

It is therefore advantageous to be able to estimate the aging of an electronic component, in order to make provision for maintenance before a potentially critical failure.

SUMMARY OF THE INVENTION

To this end, the invention provides a method for estimating the aging of an electronic component, comprising the following steps: —compiling a thermal specification of the electronic component in order to determine a reference lifetime, —determining a reference temperature quantity, —measuring the actual temperature of the electronic component in operation, —determining an actual temperature quantity, —determining an equivalent operating time at the actual temperature, transposing this equivalent operating time to the reference temperature to obtain a transposed equivalent operating time, —summing the transposed equivalent operating times to obtain a consumed lifetime comparable to the reference lifetime.

The following are particular features or embodiments, which may be used alone or in combination:

- a thermal specification comprises a series of pairs consisting of specified temperature and specified operating time, and its compilation comprises the following steps: —choosing a reference temperature, —for each pair, correcting the specified operating time, by transposing this specified operating time to the reference temperature to obtain a transposed specified operating time, —summing all the transposed specified operating times to obtain a reference lifetime,
- the specified operating time is transposed according to the formula TimeSpecTransi=TimeSpeci/ATemp, with Atemp an acceleration factor, preferably determined using the Arrhenius law according to the formula ATemp=exp[(−Ea/k)(1/Temp1−1/Temp2)] with Ea a constant activation energy equal to 0.7, k a Boltzmann constant equal to 8.62×10-5, Temp1 an initial temperature, here the specified temperature and Temp2 a final temperature, here the reference temperature,
- the reference temperature quantity is determined according to the formula QTempRef=PRef×R×TimeOnRef, with QTempRef the reference temperature quantity, PRef a reference power, preferably the reference power used to establish the thermal specification, R a thermal resistance of the electronic component and TimeOnRef a reference operating time,
- the actual temperature of the electronic component in operation is measured at least during the actual operating time,
- the actual temperature quantity is determined by integrating the actual temperature over the operating time,
- the equivalent operating time is determined via a proportional law, according to the formula TimeEquiv= (QTempCur/QTempRef)×(TimeOnRef/TimeOnCur)× TimeOnRef, with TimeEquiv the equivalent operating time, QTempCur the actual temperature quantity, QTempRef the reference temperature quantity, TimeOnRef the reference operating time and TimeOnCur the actual operating time,
- the equivalent operating time is transposed according to the formula TimeEquivTransi=TimeEquiv/ATemp, with Atemp an acceleration factor, preferably determined using the Arrhenius law according to the formula ATemp=exp[(−Ea/k)(1/Temp1−1/Temp2)] with Ea a constant activation energy equal to 0.7, k a Boltzmann constant equal to 8.62×10-5, Temp1 an initial temperature, here the actual temperature and Temp2 a final temperature, here the reference temperature,
- the method further comprises a comparing step in which a proportion of the consumed lifetime relative to the reference lifetime is computed and compared to a given threshold, preferably equal to 95%, an alarm being triggered if the threshold is exceeded.

According to a second aspect of the invention, a device comprises means for implementing such a method, wherein at least one portion of the device is installed as close as possible to the electronic component.

According to another feature, at least one portion of the device is installed remotely from the electronic component and centralizes the data of a plurality of electronic components.

BRIEF DESCRIPTION OF THE DRAWINGS

The invention will be better understood upon reading the following description, which is given merely by way of example, with reference to the appended drawings, in which:

FIG. 1 shows an electronic component in its environment,

FIG. 2 shows a thermal specification,

FIG. 3 illustrates the step of determining an actual temperature quantity,

FIG. 4 illustrates the step of compiling a thermal specification,

FIG. 5 shows a block diagram of the process.

DESCRIPTION OF THE PREFERRED EMBODIMENTS

FIG. 1 illustrates an electronic component 1, the aging with respect to temperature of which is to be estimated. To this end, the electronic component 1 is equipped with a temperature sensor 3. More and more electronic components are manufactured with a temperature sensor 3 integrated. Thus, advantageously, this integrated temperature sensor may be used. Otherwise, a dedicated temperature sensor 3 may be installed on or in proximity to the electronic component 1.

This temperature sensor 3 is used to continuously monitor the temperature of the electronic component 1. This observation of the temperature allows the thermal stresses undergone by the electronic component 1 to be estimated, and is a gateway to an estimation of its aging.

On the basis of temperature measurements taken during the life of the electronic component 1, a method estimates the actual aging of the electronic component 1 depending on the stresses actually undergone.

To this end, the method comprises the following steps:
compiling a thermal specification 2 of the electronic component 1 in order to determine a reference lifetime TotalTimeRef,
determining a reference temperature quantity QTempRef,
measuring the actual temperature TempCur of the electronic component 1 in operation,
determining an actual temperature quantity QTempCur,
determining an equivalent operating time TimeEquiv at the actual temperature TempCur,
transposing this equivalent operating time TimeEquiv to the reference temperature TempRef to obtain a transposed equivalent operating time TimeEquivTrans,
summing the transposed equivalent operating times TimeEquivTrans to obtain a consumed lifetime TotalTimeCons, comparable to the reference lifetime TotalTimeRef.

As illustrated in FIG. 5, in a block diagram in which the processed quantities have been represented by bubbles and the steps by arrows, the method may be split into three branches. A first branch, the left-most, aims to establish a reference TotalTimeRef, representative of the lifetime of the electronic component 1. The steps of this branch may advantageously be carried out, once and for all, prior to any use of the electronic component 1, in a preparatory phase that, where appropriate, may be common to all the electronic components 1 of a given type.

The thermal stresses undergone by an electronic component 1 depend on many factors: power, voltage, current, temperature, temperature variation, duration of application, etc. In order to be able to compare a stress at low temperature or power applied for a short time and a stress at high temperature applied for a longer time, and to be able to sum their effect in terms of aging of the electronic component 1, it is necessary to choose a quantity indicative of the aging. According to the invention, one possible quantity is a consistent temperature quantity equal to the product (or to the integral) of a temperature multiplied by an application time and expressed in ° C.s. This quantity will allow any thermal stress on the electronic component 1 to be related to an aging time comparable to the reference lifetime TotalTimeRef.

In the right-most branch, such a temperature quantity, referred to as the reference temperature quantity QTempRef, is determined. This reference quantity, which is characteristic of the electronic component 1, is determined for an application of a, typically arbitrary, reference temperature TempRef for a reference duration TimeOnRef. The reference duration TimeOnRef is, just like the reference power Pref, a quantity chosen to establish the thermal specification. Again, this quantity may advantageously be determined, once and for all, prior to any use of the electronic component 1, in a preparatory phase that, where appropriate, may be common to all the electronic components 1 of a given type.

The central or main branch comprises steps that are reiterated on each use or set of uses of the electronic component 1. On each use, the actual temperature TempCur of the electronic component 1 as a function of time is measured, at least over the actual operating time TimeOnCur. On the basis of these measurements, an actual temperature quantity QTempCur is determined. This actual temperature quantity QTempCur allows, relatively to the reference temperature quantity QTempRef that makes it possible to compare comparable times, an equivalent operating time TimeEquiv to be determined. This equivalent operating time TimeEquiv is then, in order to be able to compare comparable temperatures, transposed to obtain a transposed equivalent operating time TimeEquivTrans, the time and temperature conditions of which are comparable to those of the reference lifetime TotalTimeRef. All the, consistent, transposed equivalent operating times TimeEquivTrans may be summed into an actual or consumed lifetime TotalTimeCons that may be compared to the reference lifetime TotalTimeRef. The consumed lifetime TotalTimeCons, which is established and updated on each use of the electronic component 1, provides, in real time, an indicator of the consumed lifetime or, by complementarity, an indicator of the probable remaining lifetime.

According to one feature, the reference lifetime TotalTimeRef is established as follows, advantageously on the basis of a thermal specification 2. As illustrated in FIG. 2, such a thermal specification 2 comprises a plurality of pairs, comprising a specified temperature, or a temperature interval, TempSpec1-TempSpec8, generically designated TempSpeci, associated with a specified operating time TimeSpec1-TimeSpec8, generically designated TimeSpeci. Thus the thermal specification of FIG. 2 comprises eight such pairs: (TempSpec1, TimeSpec1) to (TempSpec8, TimeSpec8). A thermal specification 2 is available in that one is generally supplied with an electronic component 1 by its supplier.

In order to obtain a single quantity reflecting the reference lifetime TotalTimeRef, all these pairs are compiled. This compilation is carried out in the following way, as more particularly illustrated in FIG. 4. A reference temperature TempRef, 150° C. for example, is chosen. This choice is typically arbitrary. Next, the specified operating time TimeSpeci of each pair is transposed. The transposition modifies the operating time to make it equal to what the operating time would be if the specified temperature TempSpeci were the reference temperature TempRef. The thermal specification of FIG. 4, appearing in the first two columns, comprises five pairs. The first pair indicates a specified operating time TimeSpec1 of 4500 h for a specified temperature TempSpec1 of 80° C. The transposition of a specified temperature of 80° C. to the reference temperature of 150° introduces a corrective scalar factor of 44.77. Thus, the first transposed specified operating time TimeSpecTrans1 is equal to 4500/44.77 h or 101 h. In other words, 4500 h of operation at 80° C. causes the same aging as 101 h of operation at 150° C. The same procedure is applied to all the pairs of the thermal specification—the results have been shown in the fifth column. Next, since all the transposed specified operating times TimeSpecTransi, or "elementary agings", are consistent, they may be summed. They are summed to obtain a reference lifetime TotalTimeRef, in this case 672 h.

The transposition may be carried out using any formula modeling an influence of temperature variation on aging. According to one feature, the transposition may be carried out according to the Arrhenius law. The Arrhenius law allows an acceleration factor ATemp to be determined depending on an initial temperature and a final temperature. This factor, which is for example illustrated in the fourth column of FIG. 4, applies scalarly to an operating time or to a time before failure. The formula TimeSpecTransi=TimeSpeci/ATemp is thus applied to determine a transposed specified operating time TimeSpecTransi.

The acceleration factor ATemp is determined using the Arrhenius law, which stipulates an exponential behavior, according to the formula ATemp=λTemp1/λTemp2=exp[(−Ea/k)(1/Temp1−1/Temp2)] with λTemp1 a failure rate at an initial temperature Temp1, λTemp2 a failure rate at a final temperature Temp2, Ea a constant activation energy equal to 0.7, k a Boltzmann constant equal to 8.62×10-5, Temp1 an initial temperature and Temp2 a final temperature.

In the case of application to the compilation of the thermal specification 2, the initial temperature Temp1 is here respectively each of the specified temperatures TempSpeci and the final temperature Temp2 is the reference temperature TempRef to which everything relates back.

Let us now return to the right branch of the block diagram in FIG. 5. The method determines a reference temperature quantity QTempRef. This is done according to the formula QTempRef=PRef×R×TimeOnRef. QTempRef is a reference temperature quantity that will subsequently be used as an aging standard. PRef is a reference power. This reference power PRef is preferably the reference power used by the supplier to establish the thermal specification 2. R is a thermal resistance of electronic component 1 and TimeOnRef is a reference operating time, chosen to establish the thermal specification.

Now let us continue with the main branch of the diagram in FIG. 5. Each time the electronic component 1 is used, the actual temperature TempCur of the electronic component 1 in operation as a function of time is measured, at least during the actual operating time TimeOnCur. A single temperature may be measured, for example a maximum or an average in order to represent an operating range. Advantageously, a curve of the actual temperature TempCur as a function of time is recorded continuously, or at least during the actual operating time TimeOnCur. An example of such a curve is shown in FIG. 3.

On the basis of this actual temperature measurement TempCur, an actual temperature quantity QTempCur is determined. According to one feature, this quantity is determined by integrating the actual temperature TempCur over the actual operating time TimeOnCur. This has been illustrated in FIG. 3 by the area under the curve.

This actual temperature quantity QTempCur is indicative of the aging undergone by the electronic component 1 during the operating time TimeOnCur at the actual temperature TempCur. It is necessary at this point, in order to be able to sum the various elementary agings, to switch to a known and above all unique frame of reference. To do this, it is necessary to correct this quantity QTempCur on the one hand temporally and on the other hand with regard to temperature.

The temporal correction is achieved by dividing the actual temperature quantity QTempCur by the reference temperature quantity QTempRef determined beforehand. This allows an equivalent operating time TimeEquiv to be determined.

According to one feature, the influence of time on a thermal stress is considered to be proportional. Thus a proportional law is used, according to the formula TimeEquiv=(QTempCur/QTempRef)×(TimeOnRef/TimeOnCur)×TimeOnRef. TimeEquiv is the equivalent operating time, QTempCur the actual temperature quantity, QTempRef the reference temperature quantity, TimeOnRef the reference operating time and TimeOnCur the actual operating time.

The equivalent operating time TimeEquiv corresponds to an operation at the actual temperature TempCur. Thus, it is necessary to transpose it to a reference temperature TempRef, in order to obtain comparable quantities.

The transposition may be carried out using any formula modeling an influence of temperature variation on aging. According to one feature, the transposition may be carried out according to the Arrhenius law. The Arrhenius law allows an acceleration factor ATemp to be determined depending on an initial temperature and a final temperature. This factor applies scalarly to an operating time or to a time before failure. The formula TimeEquivTrans=TimeEquiv/ATemp is thus applied to determine a transposed equivalent operating time TimeEquivTrans.

The acceleration factor ATemp is determined using the Arrhenius law, which stipulates an exponential behavior, according to the formula ATemp=λTemp1/λTemp2=exp[(−Ea/k)(1/Temp1−1/Temp2)] with λTemp1 a failure rate at an initial temperature Temp1, λTemp2 a failure rate at a final temperature Temp2, Ea a constant activation energy equal to 0.7, k a Boltzmann constant equal to 8.62×10-5, Temp1 an initial temperature and Temp2 a final temperature.

In the case of application to the transposition of the equivalent time TimeEquiv, the initial temperature Temp1 is here the actual temperature TempCur and the final temperature Temp2 is the reference temperature TempRef to which everything relates back.

The transposed equivalent operating times, since they are all expressed in the same frame of reference, may be added. Their sum allows a consumed lifetime TotalTimeCons, which is consistent with and therefore comparable to the reference lifetime TotalTimeRef, to be determined.

According to one feature, the method further comprises a comparing step in which the consumed lifetime TotalTimeCons and the reference lifetime TotalTimeRef are compared. It is thus advantageously possible to compute a proportion of the consumed lifetime TotalTimeCons relatively to the reference lifetime TotalTimeRef and to compare it to a given threshold. According to one feature, an alarm is triggered when the threshold is exceeded. This alarm may be for the attention of the user/driver, or even of maintenance personnel. Depending on the criticality assigned to the electronic component 1, this threshold may have any value. A threshold of 95% may advantageously be adopted, to keep a margin of 5% before failure of the electronic component 1.

The invention also relates to a device comprising means for implementing such a method. As illustrated in FIG. 1, such a device may or may not incorporate the electronic component 1, a temperature sensor 3 and at least one portion 4, such as a processing unit. This portion 4 is advantageously installed as close as possible to the electronic component 1. Thus, for an automotive electronic component 1 located on board a vehicle, the portion 4 is also located on board the vehicle.

According to another feature, at least one portion 5 of the device is installed remotely from the electronic component 1 and centralizes the data of a plurality of electronic components 1. Portion 4 and portion 5 advantageously communicate by means of a wireless link.

According to one embodiment, the local portion 4 mainly ensures the acquisition of the temperature measurements. It advantageously preprocesses the data, for example it may sum the transposed equivalent operating times TimeEquivTrans, in order not to congest the link. It may for example sum the transposed equivalent operating times of one operating cycle, i.e., for a vehicle, between two instances of the ignition switch being turned off.

In contrast, the remote portion 5 performs the function of comparing with the reference lifetime TotalTimeRef. In the case where the remote portion 5 is shared between a plurality of/all the components of a given type, or of a given vehicle, it may still statistically process the uploaded data in order to improve predictive maintenance.

The invention has been illustrated and described in detail in the drawings and the foregoing description. The latter should be considered to be illustrative and given by way of example and the invention should not be considered to be limited solely thereto. Many variant embodiments are possible.

The invention claimed is:

1. A method for estimating the aging of an electronic component, the method comprising:
    compiling a thermal specification of the electronic component in order to determine a reference lifetime;
    determining a reference temperature quantity of a reference temperature;
    measuring actual temperature, by an integrated temperature sensor of the electronic component in operation;
    determining an actual temperature quantity;
    determining an equivalent operating time at the actual temperature;
    transposing the equivalent operating time to the reference temperature to obtain a transposed equivalent operating time;
    summing a plurality of obtained transposed equivalent operating times to obtain a consumed lifetime of the electronic component comparable to the reference lifetime; and
    outputting an indicator of the consumed lifetime of the electronic component.

2. The method as claimed in claim 1, wherein the reference temperature quantity is determined according to the formula:

$$Q\text{TempRef} = P\text{Ref} \times R \times \text{TimeOnRef},$$

where QTempRef is the reference temperature quantity, PRef is a reference power, R is a thermal resistance of the electronic component, and TimeOnRef is a reference operating time.

3. The method of claim 2, wherein the reference power is used to establish the thermal specification.

4. The method as claimed in claim 2, wherein the actual temperature of the electronic component in operation is measured at least during the actual operation time.

5. The method as claimed in claim 1, wherein the actual temperature of the electronic component in operation is measured at least during the actual operation time.

6. The method as claimed in claim 1, wherein the actual temperature quantity is determined by integrating the actual temperature over the actual operating time.

7. The method as claimed in claim 1, wherein the equivalent operating time is determined via a proportional law, according to the formula:

$$\text{TimeEquiv} = (Q\text{TempCur}/Q\text{TempRef}) \times (\text{TimeOnRef}/\text{TimeOnCur}) \times \text{TimeOnRef},$$

where TimeEquiv is the equivalent operating time, QTempCur is the actual temperature quantity, QTempRef is the reference temperature quantity, TimeOnRef is the reference operating time, and TimeOnCur is the actual operating time.

8. The method as claimed in claim 1, wherein the equivalent operating time is transposed according to the formula:

$$\text{TimeEquivTransi} = \text{TimeEquiv}/A\text{Temp},$$

where Atemp is an acceleration factor.

9. The method of claim 8, wherein the acceleration factor is determined using the Arrhenius law according to the formula:

$$A\text{Temp} = \exp[(-E_a/k)(1/\text{Temp1} - 1/\text{Temp2})]$$

where Ea is a constant activation energy equal to 0.7, and k is a Boltzmann constant equal to $8.62 \times 10^{-5}$, Temp1 is an initial temperature that is the specified temperature, and Temp2 is a final temperature that is the reference temperature.

10. A device comprising:
    at least one processor configured to implement the method as claimed in claim 1,
    wherein at least one portion of the device is installed as close as possible to the electronic component.

11. The device as claimed in claim 10, wherein at least one other portion of the device is installed remotely from the electronic component and centralizes the data of a plurality of electronic components.

12. A method for estimating the aging of an electronic component, the method comprising:
    compiling a thermal specification of the electronic component in order to determine a reference lifetime;
    determining a reference temperature quantity of a reference temperature;
    measuring actual temperature, by an integrated temperature sensor, of the electronic component in operation;
    determining an actual temperature quantity; determining an equivalent operating time at the actual temperature;
    transposing the equivalent operating time to the reference temperature to obtain a transposed equivalent operating time;
    summing a plurality of obtained transposed equivalent operating times to obtain a consumed lifetime of the electronic component comparable to the reference lifetime; and
    outputting an indicator of the consumed lifetime of the electronic component,
    wherein the thermal specification comprises a series of pairs consisting of a specified temperature and a specified operating time, and the compiling the thermal specification comprises:
        choosing the reference temperature,
        for each of the pairs, correcting the specified operating time, by transposing the specified operating time to the reference temperature to obtain a transposed specified operating time, and
        summing all the transposed specified operating times to obtain the reference lifetime.

13. The method as claimed in claim 12, wherein the specified operating time is transposed according to the formula:

TimeSpecTransi=TimeSpeci/$A$Temp, where Atemp is an acceleration factor, TempSpeci is the specified temperature, and TimeSpecTransi is the transposed specified operating time.

14. The method of claim 13, wherein the acceleration factor is determined using the Arrhenius law according to the formula:

$A$Temp=exp[(−Ea/k)(1/Temp1−1/Temp2)], where Ea is a constant activation energy equal to 0.7, k is a Boltzmann constant equal to $8.62 \times 10^{-5}$, Temp1 is an initial temperature that is the specified temperature, and Temp2 is a final temperature that is the reference temperature.

15. The method as claimed in claim 13, wherein the reference temperature quantity is determined according to the formula:

$Q$TempRef=$P$Ref×$R$×TimeOnRef, where QTempRef is the reference temperature quantity, PRef is a reference power, R is a thermal resistance of the electronic component, and TimeOnRef is a reference operating time.

16. The method as claimed in claim 13, wherein the actual temperature of the electronic component in operation is measured at least during the actual operation time.

17. The method as claimed in claim 12, wherein the reference temperature quantity is determined according to the formula:

$Q$TempRef=$P$Ref×$R$×TimeOnRef, where QTempRef is the reference temperature quantity, PRef is a reference power, R is a thermal resistance of the electronic component, and TimeOnRef is a reference operating time.

18. The method as claimed in claim 12, wherein the actual temperature of the electronic component in operation is measured at least during the actual operation time.

19. A method for estimating the aging of an electronic component, the method comprising:
  compiling a thermal specification of the electronic component in order to determine a reference lifetime;
  determining a reference temperature quantity of a reference temperature;
  measuring actual temperature, by an integrated temperature sensor of the electronic component in operation;
  determining an actual temperature quantity;
  determining an equivalent operating time at the actual temperature;
  transposing the equivalent operating time to the reference temperature to obtain a transposed equivalent operating time;
  summing a plurality of obtained transposed equivalent operating times to obtain a consumed lifetime of the electronic component comparable to the reference lifetime;
  computing a proportion of the consumed lifetime of the electronic component relative to the reference lifetime; and
  comparing the computed proportion to a specific threshold, an alarm being triggered when the threshold is exceeded.

20. The method of claim 19, wherein the proportion of the consumed lifetime relative to the reference lifetime is 95%.

* * * * *